(12) United States Patent
Ding et al.

(10) Patent No.: US 11,143,751 B2
(45) Date of Patent: Oct. 12, 2021

(54) SOUND SENSING WITH TIME-VARYING THRESHOLDS

(71) Applicant: TEXAS INSTRUMENTS INCORPORATED, Dallas, TX (US)

(72) Inventors: Lei Ding, Plano, TX (US); Srinath Mathur Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 539 days.

(21) Appl. No.: 16/052,042

(22) Filed: Aug. 1, 2018

(65) Prior Publication Data

US 2020/0041629 A1   Feb. 6, 2020

(51) Int. Cl.
| | |
|---|---|
| G01S 7/00 | (2006.01) |
| G01S 7/527 | (2006.01) |
| H03M 1/12 | (2006.01) |
| H03F 3/04 | (2006.01) |
| H03G 3/30 | (2006.01) |
| H03K 5/24 | (2006.01) |

(52) U.S. Cl.
CPC .............. G01S 7/5276 (2013.01); H03F 3/04 (2013.01); H03G 3/30 (2013.01); H03K 5/24 (2013.01); H03M 1/12 (2013.01); *H03F 2200/102* (2013.01)

(58) Field of Classification Search
USPC ....................................................... 356/5.01
See application file for complete search history.

(56) References Cited

U.S. PATENT DOCUMENTS

| | | | | |
|---|---|---|---|---|
| 3,209,315 | A | * | 9/1965 | Wittenborn ............. G01S 7/354 367/122 |
| 4,036,057 | A | | 7/1977 | Morais |
| 4,567,766 | A | | 2/1986 | Seiferling |
| 4,965,532 | A | * | 10/1990 | Sakurai ..................... H03L 7/02 331/4 |

(Continued)

FOREIGN PATENT DOCUMENTS

KR    20080007713 A    1/2008

OTHER PUBLICATIONS

K. Nakahira, T. Kodama, T. Furuhashi, and H. Maeda, "Design of Digital Polarity Correlators in a Multiple-User Sonar Ranging System." IEEE Transactions on Instrumentation and Measurement, vol. 54, No. 1, pp. 305-310, Feb. 2005.

(Continued)

*Primary Examiner* — James R Hulka
(74) *Attorney, Agent, or Firm* — Michael T. Gabrik; Charles A. Brill; Frank D. Cimino

(57) ABSTRACT

An ultrasonic sensing system includes: an amplifier including an input and an output; and an n-level comparator, coupled to the output of the amplifier, to compare an adjustable threshold voltage to an output signal from the output of the amplifier. N is greater than or equal to 1. The system also includes a noise power estimator, coupled to an output of the n-level comparator, to generate a noise power signal indicative of noise power of an input signal at the input of the amplifier. The system further includes a time-varying threshold circuit, coupled to the noise power estimator and the n-level comparator, to adjust the adjustable threshold voltage based on the noise power signal.

21 Claims, 7 Drawing Sheets

(56) References Cited

U.S. PATENT DOCUMENTS

| | | | |
|---|---|---|---|
| 5,648,613 A | 7/1997 | Kiefer | |
| 8,473,205 B2* | 6/2013 | Rowitch | H04B 1/7077 |
| | | | 701/468 |
| 8,777,853 B2* | 7/2014 | Kamath | A61B 5/01 |
| | | | 600/365 |
| 2002/0016547 A1* | 2/2002 | Bang | G01S 15/8979 |
| | | | 600/504 |
| 2002/0165453 A1* | 11/2002 | Bae | G01S 7/52071 |
| | | | 600/437 |
| 2003/0158479 A1* | 8/2003 | Li | G01S 7/52046 |
| | | | 600/437 |
| 2005/0180530 A1 | 8/2005 | Reiche | |
| 2009/0027095 A1 | 1/2009 | Matsui | |
| 2014/0067289 A1 | 3/2014 | Baldwin | |
| 2015/0348531 A1* | 12/2015 | Freear | G10K 11/18 |
| | | | 367/137 |
| 2019/0072327 A1* | 3/2019 | Kisner | H05B 6/108 |

OTHER PUBLICATIONS

International Search Report for PCT/US2019/044705 dated Oct. 31, 2019.
"Aspects of Signal Processing: With Emphasis on Underwater Acoustics" Part 1 Proceedings of the NATO Advanced Study Institute held at Portovenere, La Spezia, Italy; Aug. 30-Sep. 1976; pp. 187.
European Search Report for Application No. 19843070.4-1206/ 3831090 PCT/US2019044705, dated Jul. 30, 2021, 10 pages.

* cited by examiner

SOUND SENSING WITH TIME-VARYING THRESHOLDS

BACKGROUND

Ultrasonic ranging is used in a variety of applications. For example, in an automotive application, ultrasonic transducers are arranged in the bumper of an automobile. The transducers emit ultrasonic signals. The emitted ultrasonic signals reflect off nearby objects, if such objects are indeed present, and the reflected signals are sensed by the transducers. The round-trip time of the ultrasonic signals is measured, so that distance to the object can be determined.

SUMMARY

In one example, an ultrasonic sensing system includes: an amplifier including an input and an output; and an n-level comparator, coupled to the output of the amplifier, to compare an adjustable threshold voltage to an output signal from the output of the amplifier. N is greater than or equal to 1. The system also includes a noise power estimator, coupled to an output of the n-level comparator, to generate a noise power signal indicative of noise power of an input signal at the input of the amplifier. The system further includes a time-varying threshold circuit, coupled to the noise power estimator and the n-level comparator, to adjust the adjustable threshold voltage based on the noise power signal.

In another example, an ultrasonic sensing system includes: an amplifier including an input and an output; and an analog-to-digital converter (ADC), coupled to the output of the amplifier, to generate a digital output in response to an analog output signal from the output of the amplifier. The ADC is an n-bit converter. The system further includes: a bit reduction circuit, coupled to the ADC, to reduce a number of bits of the digital output based on time-varying thresholds; a noise power estimator, coupled to the ADC, to generate a noise power signal indicative of noise power of an input signal at the input of the amplifier; and a time-varying threshold circuit, coupled to the noise power estimator and the bit reduction circuit, to adjust the time-varying thresholds based on the noise power signal.

In yet another example, an ultrasonic sensing system includes: an amplifier including an input and an output; and an n-level comparator, coupled to the output of the amplifier, to compare an adjustable threshold voltage to an output signal from the output of the amplifier, wherein n is greater than or equal to 1. The system also includes: a noise power estimator, coupled to an output of the n-level comparator, to generate a noise power signal indicative of noise power of an input signal at the input of the amplifier; a time-varying threshold circuit, coupled to the noise power estimator and the n-level comparator, to adjust the adjustable threshold voltage based on the noise power signal; a correlator circuit to correlate the output of the n-level comparator with a template signal, and to generate a correlator output signal in response thereto. The system further includes: an envelope detector, coupled to the correlator circuit, to generate an envelope signal in response to the correlator output signal; and a comparator, coupled to the envelope detector, to compare the envelope signal to a threshold map signal that defines a time-varying threshold.

DETAILED DESCRIPTION

As described above, reflected ultrasonic signals are detected by an ultrasonic transducer and used to measure round-trip time to thereby determine distance to an object (which reflected the ultrasonic signals). If the object is more distant from the transducer, then the amplitude of the reflected ultrasonic transducer will be lower. For a nearby object, the reflected ultrasonic signal is much larger in amplitude than for a more distant object. Correct detection of a reflected ultrasonic signal can be difficult, due to the varying amplitude of the signal being detected.

Described embodiments are directed to a circuit that receives a signal from a transducer, such as an ultrasound transducer, and applies time-varying thresholds for the quantization of a correlator input. The threshold level varies over time and is initialized to a level based on an assessment of noise in the circuit. The noise may be relatively constant over time, so the noise amplitude and noise power generally does not vary over time after the ultrasonic signal is generated by the transducer. The circuit includes a noise power estimator that generates a signal indicative of the power level of the noise in the circuit (such as thermal noise, amplifier noise, etc.), and threshold voltages used by a comparator are varied based on the signal indicative of the noise power and based on time following generation of an ultrasonic signal generated by the transducer. The threshold voltages are generally decreased over time following the generation of the ultrasonic signal by the transducer, and reinitialized to higher levels in response to each ultrasonic signal generation.

Accordingly, the thresholds are higher for larger amplitude reflected signals detected by the transducer and lower for lower amplitude reflected signals. With the threshold voltages set higher for larger amplitude reflected signals and lower for lower amplitude reflected signals, the signal-to-noise ratio is generally maintained at a sufficiently high level for adequate distance determination assessment.

Figure 1:
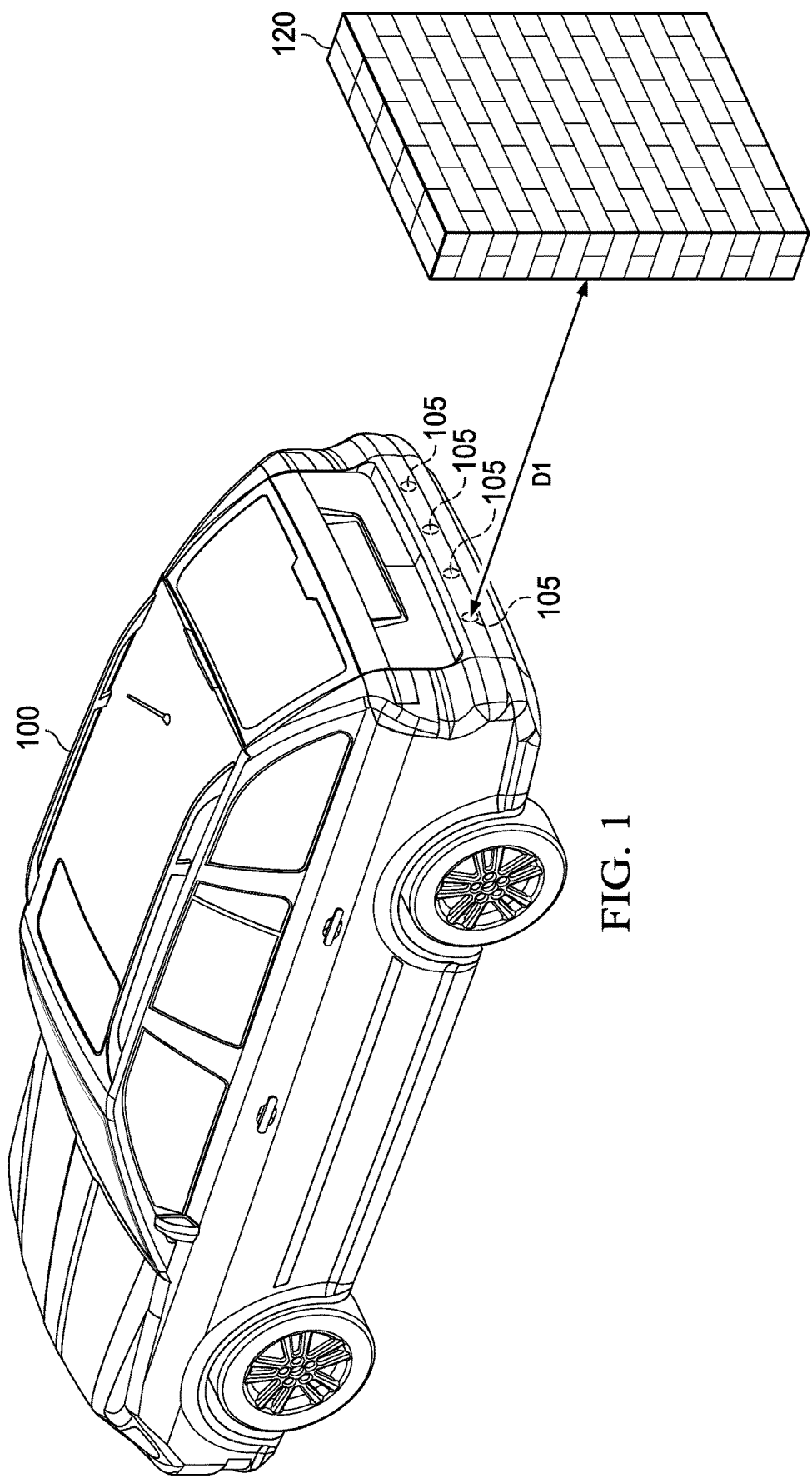
FIG. 1 illustrates an automobile with ultrasonic sensors to measure distance to an object in described examples.

As described above, one application for an ultrasonic ranging system is an automobile, but other applications for the use of distance measuring systems based on ultrasound are also possible. FIG. 1 illustrates an automobile 100. The automobile includes one or more ultrasonic transducers in either or both of the front and rear bumpers. In the example of FIG. 1, four ultrasonic transducers 105 are shown. The number of transducers in each bumper can be other than four in other examples. For simplicity, the ultrasonic transducers are referred to herein as transducers. In some examples, ultrasonic transducers are used as transducers 105. But in other examples, transducers 105 may include other types of transducers (in addition to, or instead of, ultrasonic transducers). Each ultrasonic transducer emits a sound wave at a specific frequency and then detects a reflection of the sound waves after they have bounced off an object (e.g., object 120) and returned to the transducer. Sound travels through air at about 344 meters/second (1129 feet/second). The elapsed time, between when the sound is first emitted from the transducer and when the reflected sound wave is detected back at the transducer, can be measured by circuitry coupled to the transducer. The total round-trip distance is the product of speed of sound and the measured time. The distance between the transducer and an object (e.g., D1 in FIG. 1) is then given by:

$$distance = \frac{speed\ of\ sound \times time}{2}$$

A wide range of frequencies can be used for the sound waves (also referred to herein as "sound signals") generated by the transducers 105. In some examples, the sound waves have frequency(ies) above the frequencies that humans can typically hear. For example, the sound waves may have frequencies above 20,000 Hz, but frequencies below 20,000 Hz are also possible. In one example, the frequency is 50 KHz, and the emitted sound waves comprise a number of pulses (e.g., 15-20 pulses) of the 50 KHz signal.

In some implementations, the transducers 105 emit the same frequency (e.g., 50 KHz), but they do so in sequential fashion, so one transducer 105 emits a sound signal and waits for a predetermined period of time for a reflection before the next transducer 105 is permitted to emit its sound signal. In other implementations, a different signal signature is implemented by each transducer 105. For example, a 50 KHz can be modulated in a unique way (e.g., using frequency modulation) for use by each transducer. Accordingly, all of the transducers 105 can emit their sound signals simultaneously. Each emitted sound signal is uniquely coded for a specific transducer 105, so the reflected sounds signals are likewise unique and are readily differentiated by the circuitry connected to each transducer.

Figure 2:
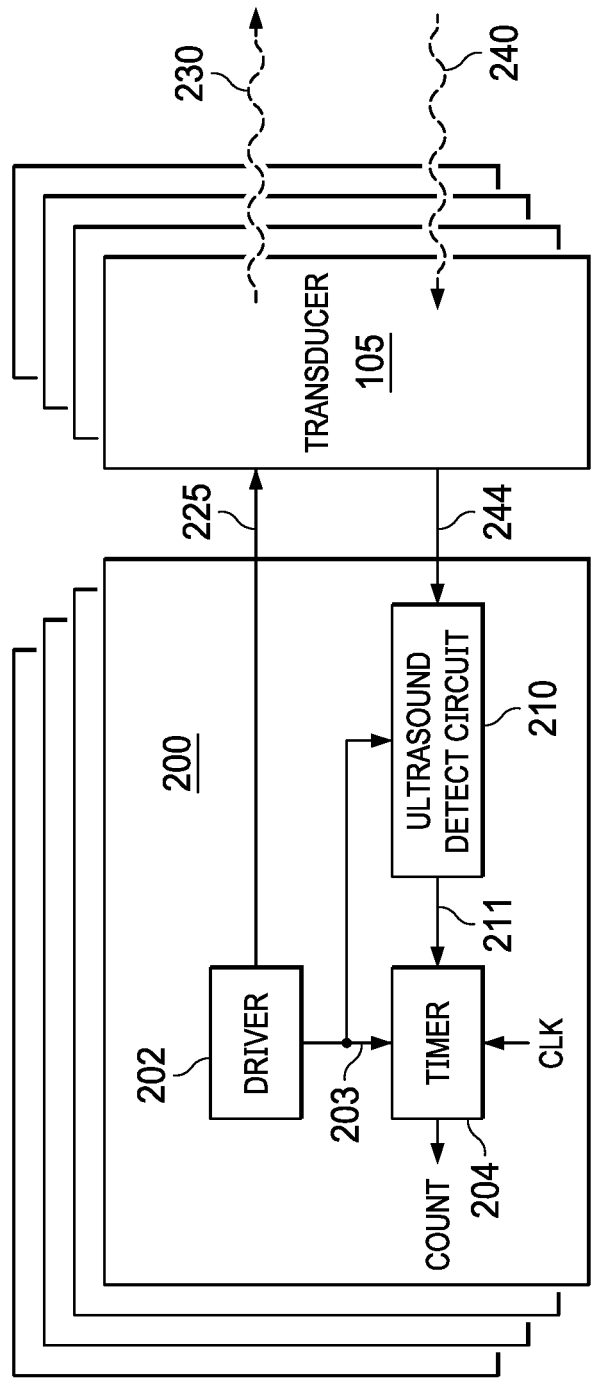
FIG. 2 is a block diagram of ultrasonic transducers and corresponding circuitry in described examples.

FIG. 2 illustrates multiple transducers 105. Each transducer 105 is coupled to a respective corresponding circuit 200 that operates such transducer. The circuit 200 includes a driver 202. The driver 202 generates an electrical signal 225, which is converted to a sound signal 230 by the transducer 105. The driver 202 asserts a control signal 203 to a timer 204. In response to such assertion of the control signal 203, the timer 204 initiates its measurement of time, such as by counting pulses of a periodic clock signal (CLK). Each transducer 105 also can receive a sound signal 240 (e.g., a sound signal reflected by object 120) and convert the received sound signal 240 to an electrical signal 244. An ultrasound detect circuit 210 receives and processes the electrical signal 244 (which is indicative of the reflected sound signal 240). The ultrasound detect circuit 210 processes electrical signal 244 to determine when a reflected sound signal has been received by the transducer 105. In response to determining that a reflected sound signal has been received by the transducer 105, the ultrasound detect circuit 210 generates a control signal 211 to the timer 204. In response to such generation of the control signal 211, the timer 204 ceases its measurement of time (e.g., ceases counting pulses of the periodic clock signal). Accordingly, the count value (COUNT) of the timer 204 is indicative of: (a) the time that elapsed between when the sound signal 230 was emitted by the transducer 105 and when a reflected sound signal 240 was received by the transducer; and (b) likewise, distance to the object.

As described above, the magnitude of the reflected sound signal 240 (and thus the magnitude of the equivalent electrical signal 244) is a function of distance D1 to the object 120. As distance to object 120 increases, the magnitude of sound signal 240 (electrical signal 244) generally decreases. In described examples, the ultrasound detect circuit 210 implements a variable threshold to detect the occurrence of a reflected sound signal. The threshold is set relatively high immediately after transmission of the sound signal 230 from the transducer 105. Progressively lower thresholds are implemented in the ultrasound detect circuit 210 over increasing time, following the transmission of the sound signal 230. After the next sound signal 230 is generated by the transducer 105, the process repeats, and the threshold is again set high and then lowered over time.

Figure 3:
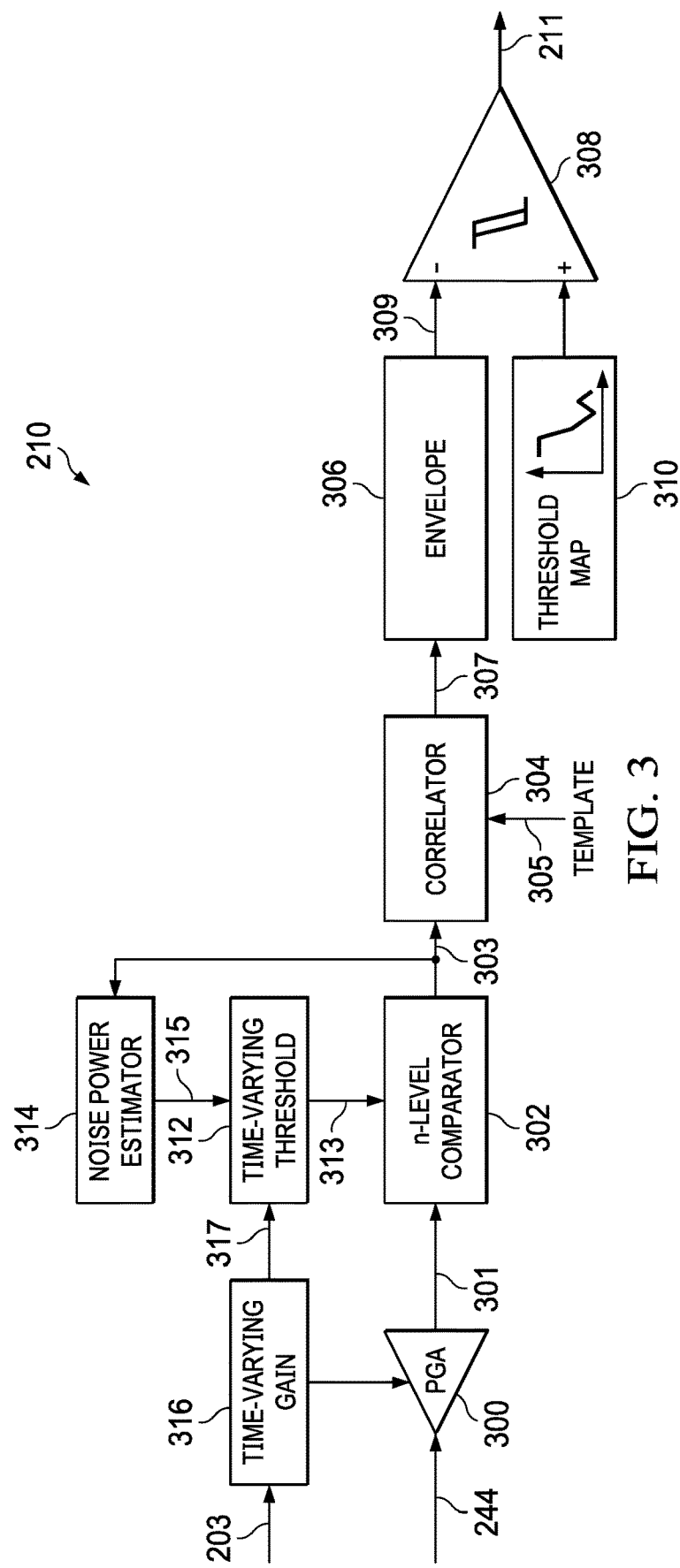
FIG. 3 shows a portion of the circuitry usable with ultrasonic transducers in described examples.

FIG. 3 shows an example implementation of the ultrasound detect circuit 210. The ultrasound detect circuit 210 in FIG. 3 includes a programmable gain amplifier 300, an n-level comparator 302, a correlator 304, an envelope detector 306, a comparator 308, a threshold map 310, a time-varying threshold circuit 312, a noise power estimator 314, and a time-varying gain control 316. The programmable gain amplifier 300 amplifies the incoming signal 244 and provides the amplified signal 301 to the n-level comparator 302.

Figure 4:
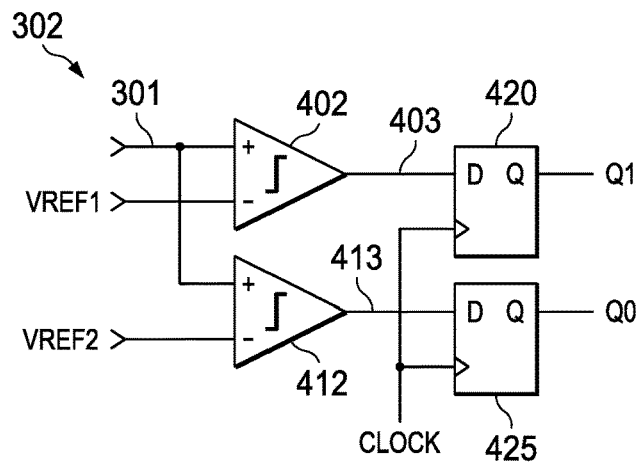
FIG. 4 illustrates an example n-level comparator.

The n-level comparator 202 compares the amplified signal 301 to n−1 voltage thresholds. For example, in the case of a 3-level comparator (i.e., n=3), the comparator 302 compares the amplified signal 301 to 2 different voltage thresholds. FIG. 4 shows an example 3-level comparator in which the amplified signal 301 is compared to threshold voltage VREF1 and to voltage threshold VREF2. The threshold voltages VREF1 and VREF2 are provided by the time-varying threshold circuit 312 (described below). The 3-level comparator in the example of FIG. 4 includes two comparators 402 and 412. Each comparator has a positive input (+) and a negative input (−). The amplified signal 301 is provided to the positive inputs of both comparators. VREF1 is provided to the negative input of comparator 402, and VREF2 is provided to the negative input of comparator 412.

Comparator 402 generates an output 403 that indicates whether the amplified signal 301 is greater or less than VREF1. In the example of FIG. 4, output 403 from comparator 402 will be: logic high if the amplified signal 301 is greater than VREF1; or logic low if the amplified signal 301 is smaller than VREF1. Similarly, comparator 412 generates an output 413 that indicates whether the amplified signal 301 is greater or less than VREF2. Output 413 from comparator 412 will be: logic high if the amplified signal 301 is greater than VREF2; or logic low if the amplified signal 301 is smaller than VREF2.

Each output 403, 413 is latched by a respective D flip-flop 420 as corresponding D flip-flop output signals Q1 and Q0. The D flip-flops 420, 425 are repeatedly clocked by a clock signal (not necessarily the same clock as illustrated in FIG. 2) to thereby generate a sequence of Q1, Q0 output signal pairs. Each Q1, Q0 output signal pair encodes the relative size of the amplified signal at the moment of an active clock edge to VREF1 and VREF2. If VREF1 is greater than VREF2 (or VREF1 is a positive voltage and VREF2 is a negative voltage of the same absolute value as VREF1), then Q1, Q0 indicate whether the amplified signal 301 is: greater than VREF1; between VREF1 and VREF2; or smaller than VREF2. If the amplified signal 301 is greater than VREF1, then Q1 and Q0 will both be logic high (Q1, Q0='11'). If the amplified signal 301 is between VREF1 and VREF2, then: Q1 will be logic low; and Q0 will be logic high (Q1, Q0='10'). If the amplified signal 301 is smaller than VREF2, then both Q1 and Q0 will be logic low (Q1, Q0='00').

Referring again to FIG. 3, the output 303 from the n-level comparator (Q1 and Q0 in the example of FIG. 4) is provided to the correlator 304. The correlator 304 correlates the n-level comparator's output to one or more templates 305. Each template 305 is a digitized version of the input signal 225, which is generated by the driver 202 and provided to the transducer 105 for conversion to a transmitted sound signal 230.

Figure 5:
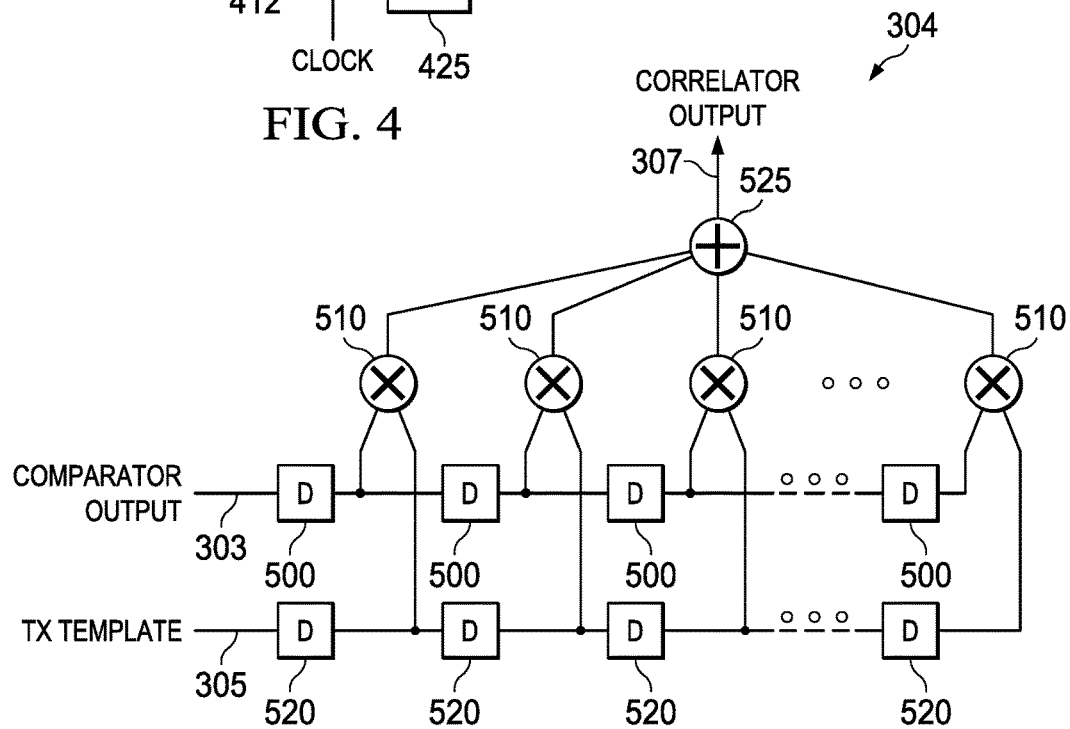
FIG. 5 illustrates an example correlator.

FIG. 5 shows an example correlator 304. In this example, the correlator 304 includes a series of delay buffers 500 through which the comparator output 303 flows, and a series of corresponding delay buffers 520 through which the template 305 flows. Each delay buffer 500, 520 may implement the same amount of time delay as the other delay buffers. The output of corresponding delay buffers 500, 520 are then multiplied together as shown by multipliers 510, and the output of the multipliers 510 is then summed together by an adder 525 to produce the correlator output 307. The correlator output 307 at a given instant of time is a multi-bit digital signal that indicates how closely the received sound signal 240 matches the expected sound signal, based on the transmitted sound signal 230 at that particular instant of time.

Figure 6:
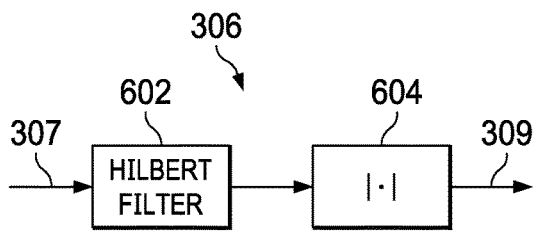
FIG. 6 shows an envelope detector in an example.

Referring again to FIG. 3, the correlator output 307 is provided to envelope detector 306. The envelope detector 306 generates an output envelope signal 309 that generally tracks the envelope (e.g., the peaks) of the correlator output 307. FIG. 6 shows an example implementation of envelope detector 306. This envelope detector example includes a Hilbert filter 602 and an absolute value circuit 604. For a real input signal xr, the Hilbert filter generates a complex analytic signal, xr+j*xi, where $j=\sqrt{-1}$, and xi is the signal xr with 90 degree phase shift. The absolute value of the complex analytic signal, |xr+xi|, is defined as $\sqrt{xr^2+xi^2}$, which is the envelope of the signal xr.

Referring again to FIG. 3, the comparator 308 compares the output envelope signal 309 (from the envelope detector 306) to a threshold map 310 to generate the control signal 211 described above. The threshold map defines a time-varying threshold that indicates valid objects when the signal envelope is above the threshold. The threshold is usually set to be above the expected noise or false echoes at a given distance. For example, the threshold map can be defined to avoid false resulting from the ground or small objects.

Figure 7:
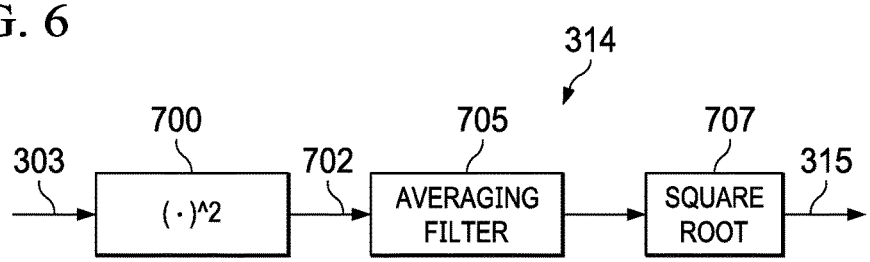
FIG. 7 shows an example noise power estimator.

In described examples, the threshold voltages 313 for use by the n-level comparator 302 (e.g., VREF1 and VREF2 in the example 3-level comparator of FIG. 4) are initially set at a relatively high level in response to initial transmission of the outgoing sound signal 230 and are then lowered over time to account for the diminishment of the received sound signal amplitude over time. The threshold voltages 313 are determined based on: (a) the noise power of the circuit; and (b) time. If baseline noise power is higher, then the threshold voltages 313 will be set higher than if the baseline noise power was lower. Accordingly, noise power estimator 314 estimates the magnitude of the noise power in the circuit. FIG. 7 shows an example implementation of a noise power estimator 314. In the example of FIG. 7, the noise power estimator includes a squaring circuit 700 coupled to an averaging filter 705. In the example 3-level comparator for n-level comparator 302, in which the output bits are 11, 01 and 00 as described above: (a) 11 corresponds to +1; (b) 00 corresponds to −1; and (c) 01 corresponds to 0. Thus, squaring +1 should result in 1, whereas squaring 01 should result in 0, and squaring 00 should result in 1. Accordingly, the output of the squaring circuit 700 should be: a logic high ("1") when the comparator's output 303 is 11 or 00; or a logic low ("0") when the comparator's output 303 is 01. The squaring circuit 700 can be implemented as a collection of logic gates. In other implementations, the squaring circuit 700 is implemented as a multiplier. The output 702 of the squaring circuit 700 is then filtered by averaging filter 705, such as an infinite impulse response (IIR) filter or a finite impulse response (FIR) filter. The output of the averaging filter 705 is a signal 315 that specifies the noise power. The averaging filter 705 is coupled to a square root circuit 902, which determines the square root of the noise power output of the averaging filter 805. The square root of noise power is the standard deviation of the noise power.

In some cases, the noise power is measured before each burst when no echoes are expected in the received signal. Alternatively, the noise power can be measured after each burst at a time when no echoes are otherwise expected. The noise power can be tracked over time to exclude erroneous values that may be caused by unexpected echoes in the received signal from other adjacent ultrasonic sources.

Figure 8:
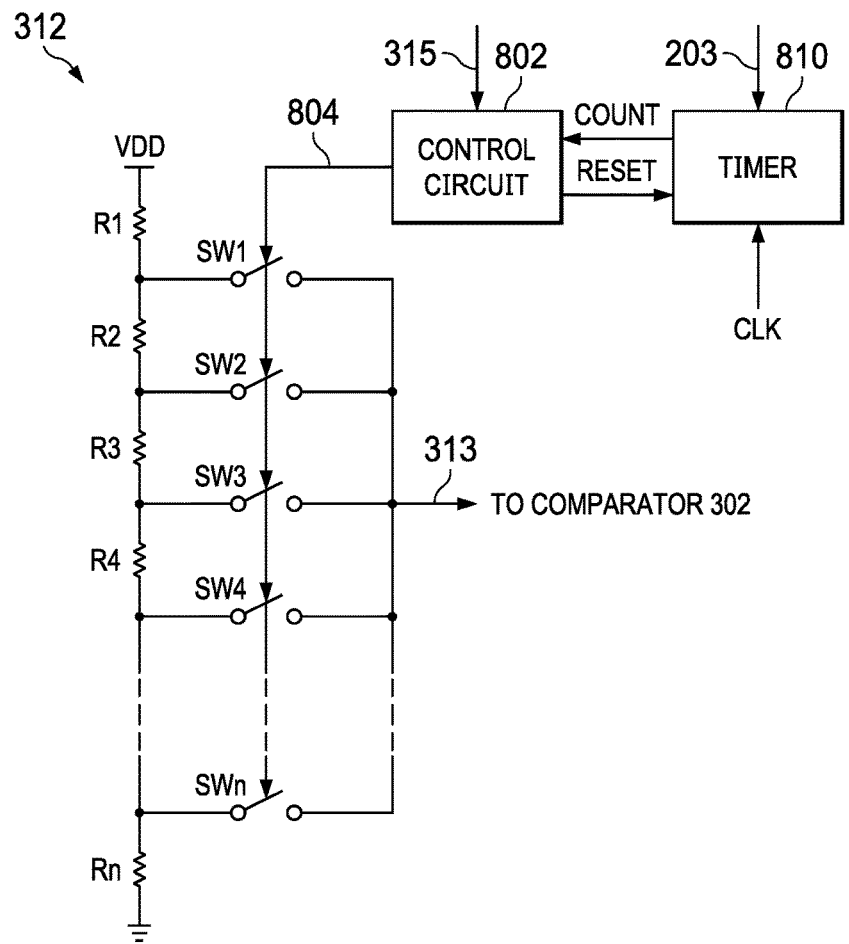
FIG. 8 shows a voltage threshold generator in described examples.

FIG. 8 shows an example portion of time-varying threshold circuit 312. In this example, the time-varying threshold circuit 312 includes a resistor divider network comprising: resistors R1, R2, R3, R4, . . . , Rn; switches SW1, SW2, SW3, SW4, . . . , SWn; a control circuit 802; and a timer 810. The resistors R1-Rn are connected in series between VDD and ground, and they provide varying voltages between VDD and ground from the nodes interconnecting pairs of resistors. A switch SW1-SWn is connected to each inter-resistor node and, when closed, provides that node voltage to the n-level comparator 302. A separate resistor divider network may be included to generate each voltage threshold. Responsive to signal 315 from the noise power estimator 314, the control circuit 302 generates control signals 804 to close one the switches SW1-SWn to thereby generate the appropriate voltage threshold. The timer 810 receives the control signal 203 from the driver 202. The control signal 203 indicates the time when a burst of sound signals 230 are transmitted via the transducer 105. The timer 810 counts pulses of a clock signal (CLK) and outputs a count value (COUNT) to the control circuit 802. In some examples, the timer 810 is a count-up counter that outputs count values starting at 0 in response to assertion of control signal 203. In response to receiving the initial count value of 0 from the timer 810, the control circuit 802 asserts a control signal 804 to cause one of the switches SW1-SWn to close (with the remaining switches left open). The switch that is initially closed by control circuit 802 corresponds to a resistor divider voltage that is higher than the noise level measured for the circuit, but less than the magnitude of the amplified signal 301 (which can be determined a priori for different distances D1 and thus at different times). For example, at short distances, VREF1 can be set to twice the noise standard deviation (square root of noise power). Accordingly, most of the noise will be converted to zero at the comparator output, while most of the echo signal will be converted to 1's or −1's. In some examples, as time progresses following assertion of control signal 804, the control circuit 802 asserts control signals 804 to open and close different switches to thereby select different (and lower) voltages from the resistor divider to be provided as a threshold voltage to the n-level comparator 302. For example, at longer distances, VREF1 can be set to 0.25 times (one-quarter) the noise standard deviation (square root of noise power). At this level, even if the echo signal amplitude is buried in noise, each signal can still be converted into the comparator output in addition to noise. The signal can then be recovered through the correlator, although at a lower SNR than the short distance case.

Figure 9:
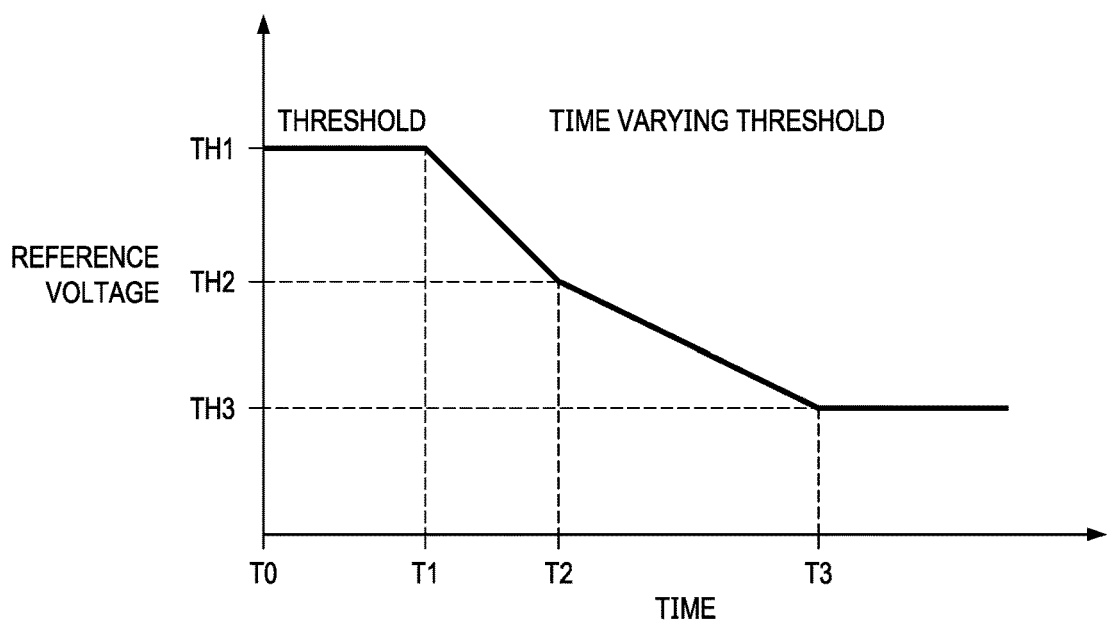
FIG. 9 illustrates the time progression of the threshold voltage(s) in described examples.

FIG. 9 illustrates an example downward progression of the threshold voltage over time, starting at time T0 when control signal 203 is asserted. Initially, the threshold voltage is set at level TH0 until time T1 is reached (e.g., when the count value from timer 810 reaches a predetermined value).

In some implementations, the threshold voltages 313 are generated for use by the n-level comparator 302, based on an estimate of the noise power in the circuit and time, as described above. However, in some implementations, the gain of the programmable gain amplifier 300 is dynamically changed by the time-varying gain control 316. As described above, the received reflected sound signal 240 has a progressively smaller amplitude as distance D1 increases (and thus as time increases following transmission of the initial sound signal 230). In response to assertion of control signal 203, the time-varying gain control 316 asserts a control signal to the programmable gain amplifier 300 to initially set its gain at a lower level. This is because, if a reflected sound signal 240 is received soon after the transmission of the outgoing sound signal 230, then the magnitude of the reflected sound signal 240 (received by the programmable gain amplifier 300) will be relatively high. However, as time progresses following the transmission of the outgoing sound signal 230: (a) any incoming reflected sound signal 240 will have a progressively lower amplitude; and (b) accordingly, the time-varying gain control 316 (which may implement a timer such as illustrated in FIG. 8) asserts a control signal to the programmable gain amplifier 300 to thereby cause its gain to be increased.

Figure 10:
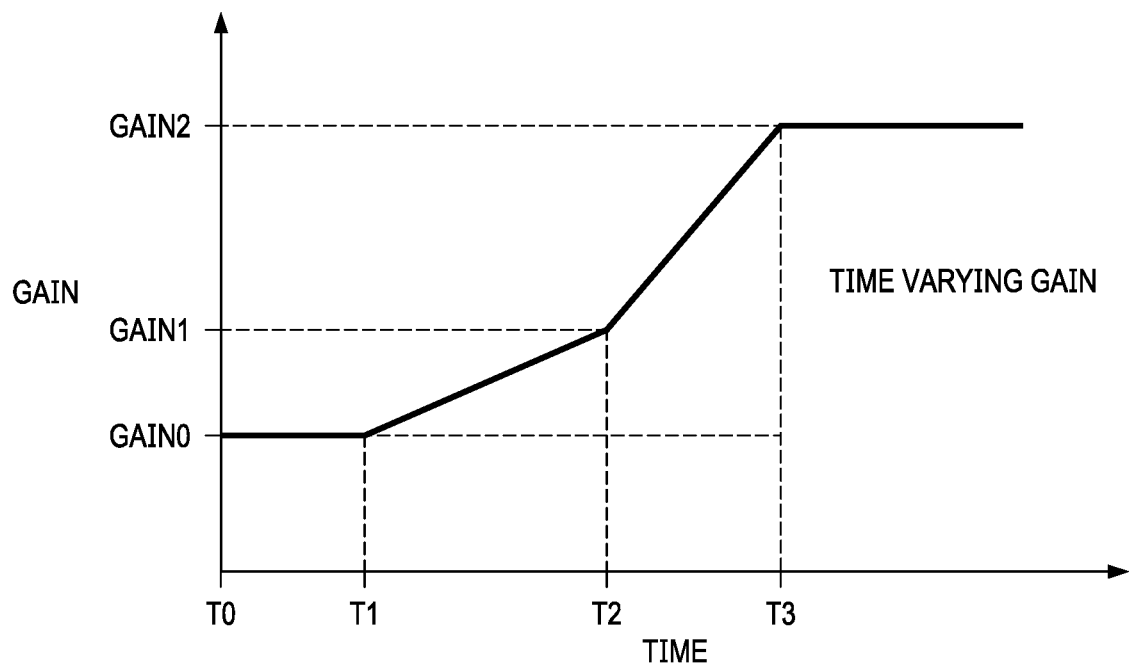
FIG. 10 illustrates the time progression of the variable gain of a programmable gain amplifier in described examples.

FIG. 10 illustrates an example increase in gain of the programmable gain amplifier 300 over time, from a relatively low gain setting (GAIN0 at time T0) to a higher gain setting (GAIN2 at time T2).

The change in gain of the programmable gain amplifier 300 also changes the magnitude of the estimate noise power. In some implementations, the time-varying gain control 316 generates a signal 317 to the time-varying threshold circuit 312 to indicate the gain setting of the programmable gain amplifier 300. The time-varying threshold circuit 312 uses the signal 317 to dynamically set the threshold voltages 313 for the n-level comparator. In one example, the time-varying threshold circuit 312 implements a look-up table for generating the threshold voltages 313 based on: the gain setting indicated via signal 317 from the time-varying gain control 316; and the signal 315 from the noise power estimator 314. The time-varying threshold is determined for a fixed amplifier gain. As amplifier gain varies with time, the threshold is adjusted accordingly. For example, if V1 is the original threshold voltage setting at a given time instant t1 and gain A1, then the threshold voltage is changed to V1*A2/A1 if the gain at this time instant t1 changes to A2.

Figure 11:
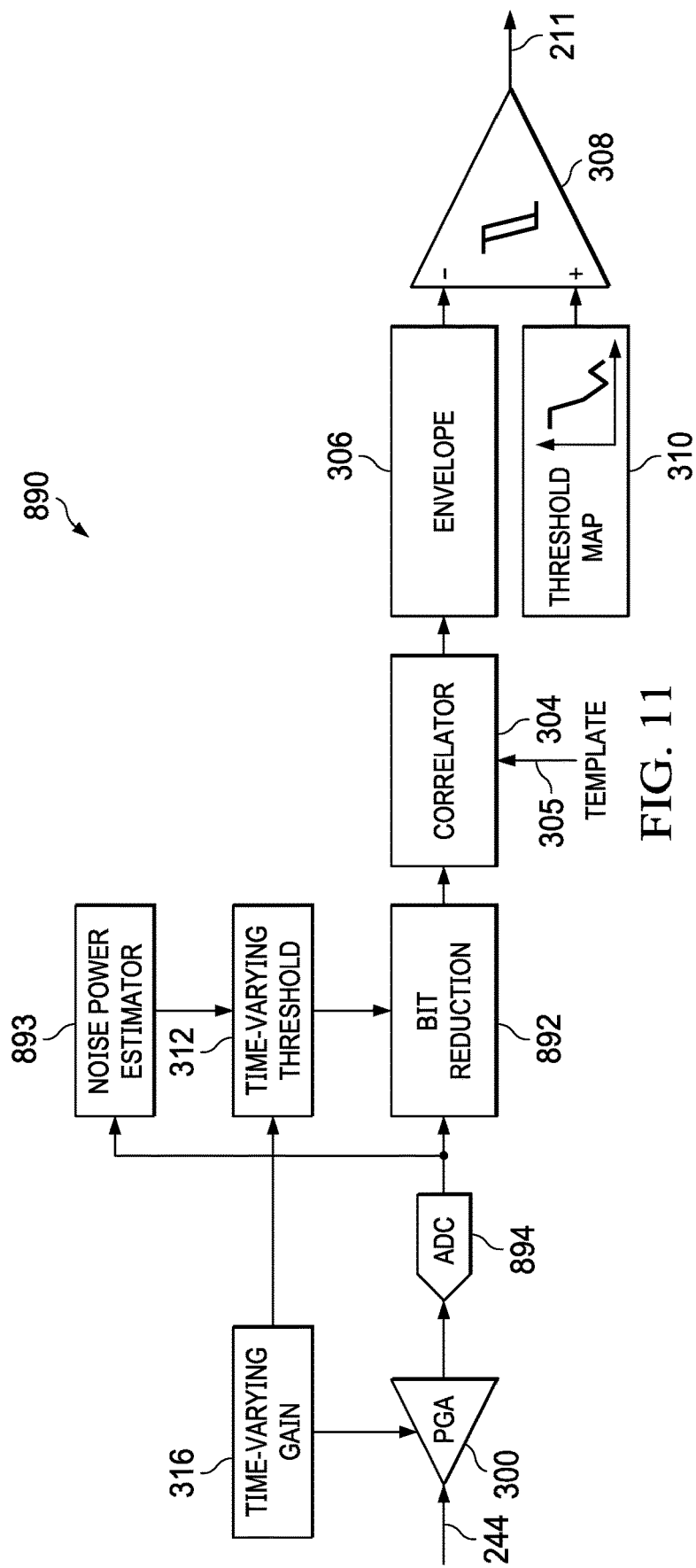
FIG. 11 shows another example portion of the circuitry usable with ultrasonic transducers.

FIG. 11 shows an implementation of an ultrasound detect circuit 890 similar to FIG. 3, but with an analog-to-digital converter (ADC) 891 and a bit reduction circuit 892 instead of the n-level comparator 302. The ADC 892 may have any size, such as a 3-bit, 4-bit, etc. ADC converter. The bit reduction circuit 892 reduces the output number of bits from the ADC 892 for correlation with the template 305 by the correlator 304. The noise power estimator 893 in FIG. 11 may be implemented as shown in FIG. 12.

The gain of the programmable gain amplifier 300 and the ADC reference signals are set to predefined values in this example, based on the expected noise level. If the ADC output bits show a toggling of 1's and 0's in only their least significant 1 or 2 bits, then the gain of the programmable gain amplifier 700 is increased to the point at which a number of least significant bits (such as at least the least significant four bits) from the ADC 894 are toggling.

Figure 12:
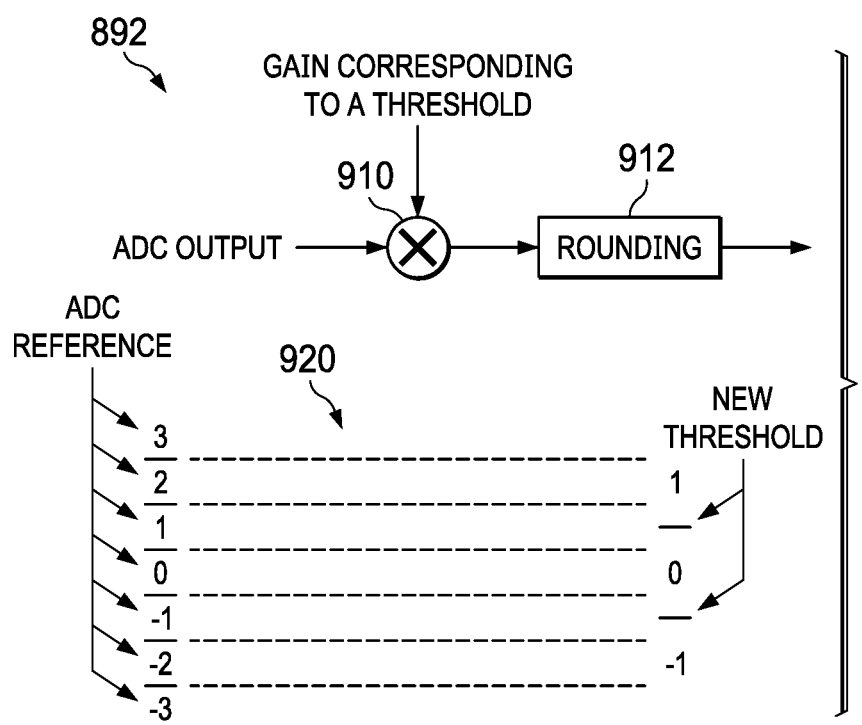
FIG. 12 illustrates an example bit reduction circuit in various implementations.

FIG. 12 shows an example implementation of the bit reduction circuit 892 to include a multiplier 910 and a rounding function 912. The bit reduction circuit 892 reduces the number of output bits from the ADC 894, such as from 8 to 12 bits down to a lower number of bits, through time-varying thresholds generated by the time-varying threshold circuit 312 as described above. For example, if the ADC output is a 3-bit output permitting seven different levels, and if the correlator 304 is capable of three different levels, then the bit deduction circuit 892 converts the seven-level ADC output down to three different levels as illustrated in FIG. 13.

As described above, the gain of the programmable gain amplifier 300 and the reference signals for the ADC are set to predefined values based on the expected noise level. For the example using a relatively few number of comparator levels (e.g., a 3-level comparator), the percentage of ones in the comparator output (denoted as R1) is determined. VREF2 can be set to the opposite polarity voltage as VREF1, or the reference voltages can be independently adjusted. VREF1 is then adjusted, so that R1 is within the range of 20% to 40%. After VREF1 is stable, R1 is recorded. Similarly, the percentage of zeros in the comparator output (denoted as R2) is determined, and R2 is recorded when VREF1 is stable. The mean value and the standard deviation value (square root of noise power) are calculated by the noise power estimator (e.g., implemented as microcontroller or discrete circuit) and are related to the VREF1/VREF2 and to R1/R2 through the "Q" function, because noise generally follows a Gaussian distribution.

$$Q\left(\frac{VREF1 - \mu}{\sigma}\right) = R1$$

$$Q\left(\frac{VREF1 - \mu}{\sigma}\right) = R2$$

$$Q(z) = \int_z^\infty \frac{1}{\sqrt{2\pi}} e^{-\frac{y^2}{2}} dy$$

A Qinv(z) function is the inverse of the Q(z) function and can be implemented as a look-up table. The formula for calculating the mean ($\mu$) and the standard deviation ($\sigma$) of the noise power is:

$$\sigma = \frac{VREF1 - VREF2}{Qinv(R1) - Qinv(R2)}$$

$$\mu = \frac{Qinv(R1)VREF1 - Qinv(R2)VREF1}{Qinv(R1) - Qinv(R2)}$$

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. An ultrasonic sensing system, comprising:
   an amplifier including an input and an output;
   an n-level comparator, coupled to the output of the amplifier, to compare an adjustable threshold voltage to an output signal from the output of the amplifier, wherein n is greater than or equal to 1;
   a noise power estimator, coupled to an output of the n-level comparator, to generate a noise power signal indicative of noise power of an input signal at the input of the amplifier; and
   a time-varying threshold circuit, coupled to the noise power estimator and the n-level comparator, to adjust the adjustable threshold voltage based on the noise power signal and based on a signal indicative of a gain configuration of the amplifier.

2. The ultrasonic sensing system of claim 1, wherein the n-level comparator includes a 3-level comparator, and the adjustable threshold voltage includes a first adjustable threshold voltage and a second adjustable threshold voltage.

3. The ultrasonic sensing system of claim 2, wherein the 3-level comparator includes: a first comparator to compare the output signal to the first adjustable threshold voltage; and a second comparator to compare the output signal to the second adjustable threshold voltage.

4. The ultrasonic sensing system of claim 2, wherein the time-varying threshold circuit is coupled to adjust both the first and second adjustable threshold voltages, based on the noise power signal.

5. The ultrasonic sensing system of claim 1, wherein the noise power estimator is coupled to generate the noise power signal within a predetermined period of time in response to transmission of a burst of ultrasound pulses.

6. The ultrasonic sensing system of claim 5, wherein the amplifier is a variable-gain amplifier, and the time-varying threshold circuit is coupled to adjust the adjustable threshold voltage based on: a time-varying gain configuration of the variable-gain amplifier; and the noise power signal.

7. The ultrasonic sensing system of claim 1, further comprising a correlator circuit to correlate an output from the n-level comparator with a template signal.

8. The ultrasonic sensing system of claim 1, further comprising a transducer, coupled to the input of the amplifier, to transmit an ultrasonic signal and to receive a reflected ultrasonic signal to be amplified by the amplifier.

9. An ultrasonic sensing system, comprising:
   an amplifier including an input and an output;
   an analog-to-digital converter (ADC), coupled to the output of the amplifier, to generate a digital output in response to an analog output signal from the output of the amplifier, wherein the ADC is an n-bit converter;
   a bit reduction circuit, coupled to the ADC, to reduce a number of bits of the digital output based on time-varying thresholds;
   a noise power estimator, coupled to the ADC, to generate a noise power signal indicative of noise power of an input signal at the input of the amplifier; and
   a time-varying threshold circuit, coupled to the noise power estimator and the bit reduction circuit, to adjust the time-varying thresholds based on the noise power signal.

10. The ultrasonic sensing system of claim 9, wherein the noise power estimator is coupled to generate the noise power signal as the standard deviation of the noise power.

11. The ultrasonic sensing system of claim 9, wherein the noise power estimator is coupled to generate the noise power signal within a predetermined period of time in response to transmission of a burst of ultrasound pulses.

12. The ultrasonic sensing system of claim 9, wherein the amplifier is a variable-gain amplifier, and the time-varying threshold circuit is coupled to adjust the time-varying thresholds based on: a time-varying gain configuration of the variable-gain amplifier; and the noise power signal.

13. The ultrasonic sensing system of claim 9, further comprising a transducer, coupled to the input of the amplifier, to transmit an ultrasonic signal and to receive a reflected ultrasonic signal to be amplified by the amplifier.

14. The ultrasonic sensing system of claim 13, further comprising:
    a correlator, coupled to the bit reduction circuit, to correlate an output from the bit reduction circuit with a template signal, wherein the template signal is a digitized version of a transducer signal generated for the transducer.

15. The ultrasonic sensing system of claim 14, further comprising a timer to count pulses of a clock signal between: a time at which the transducer signal is generated for the transducer; and a time at which the reflected ultrasonic signal is detected.

16. The ultrasonic sensing system of claim 9, wherein the bit reduction circuit includes a multiplier.

17. An ultrasonic sensing system, comprising:
    an amplifier including an input and an output;
    an n-level comparator, coupled to the output of the amplifier, to compare an adjustable threshold voltage to an output signal from the output of the amplifier, wherein n is greater than or equal to 1;
    a noise power estimator, coupled to an output of the n-level comparator, to generate a noise power signal indicative of noise power of an input signal at the input of the amplifier;
    a time-varying threshold circuit, coupled to the noise power estimator and the n-level comparator, to adjust the adjustable threshold voltage based on the noise power signal;
    a correlator circuit to correlate the output of the n-level comparator with a template signal, and to generate a correlator output signal in response thereto;
    an envelope detector, coupled to the correlator circuit, to generate an envelope signal in response to the correlator output signal; and
    a comparator, coupled to the envelope detector, to compare the envelope signal to a threshold map signal that defines a time-varying threshold.

18. The ultrasonic sensing system of claim 17, wherein the n-level comparator includes a 3-level comparator, and the adjustable threshold voltage includes a first adjustable threshold voltage and a second adjustable threshold voltage.

19. The ultrasonic sensing system of claim 18, wherein the time-varying threshold circuit is coupled to adjust both the first and second adjustable threshold voltages, based on the noise power signal.

20. The ultrasonic sensing system of claim 17, wherein the amplifier is a variable-gain amplifier, and the time-varying threshold circuit is coupled to adjust the adjustable threshold voltage based on: a time-varying gain configuration of the variable-gain amplifier; and the noise power signal.

21. The ultrasonic sensing system of claim 17, further comprising a transducer, coupled to the input of the amplifier, to transmit an ultrasonic signal and to receive a reflected ultrasonic signal to be amplified by the amplifier.

\* \* \* \* \*